United States Patent
De Silva et al.

(10) Patent No.: US 10,176,997 B1
(45) Date of Patent: Jan. 8, 2019

(54) DIRECT GATE PATTERNING FOR VERTICAL TRANSPORT FIELD EFFECT TRANSISTOR

(71) Applicant: INTERNATIONAL BUSINESS MACHINES CORPORATION, Armonk, NY (US)

(72) Inventors: Ekmini A. De Silva, Slingerlands, NY (US); Indira Seshadri, Niskayuna, NY (US); Stuart A. Sieg, Albany, NY (US); Wenyu Xu, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/700,246

(22) Filed: Sep. 11, 2017

(51) Int. Cl.
*H01L 21/8238* (2006.01)
*H01L 21/28* (2006.01)
*H01L 21/3213* (2006.01)
*H01L 29/51* (2006.01)
*H01L 27/092* (2006.01)
*H01L 29/66* (2006.01)

(52) U.S. Cl.
CPC .. *H01L 21/28123* (2013.01); *H01L 21/28088* (2013.01); *H01L 21/32139* (2013.01); *H01L 21/823842* (2013.01); *H01L 21/823857* (2013.01); *H01L 27/0922* (2013.01); *H01L 29/517* (2013.01); *H01L 29/66545* (2013.01)

(58) Field of Classification Search
USPC ........................................................ 438/212
See application file for complete search history.

(56) References Cited

U.S. PATENT DOCUMENTS

| | | |
|---|---|---|
| 5,847,463 A | 12/1998 | Trivedi et al. |
| 8,048,810 B2 | 11/2011 | Tsai et al. |
| 8,986,921 B2 | 3/2015 | Edelstein et al. |
| 9,087,876 B2 | 7/2015 | Nguyen et al. |
| 9,123,656 B1 | 9/2015 | Hsieh et al. |
| 9,368,572 B1 | 6/2016 | Cheng et al. |

(Continued)

OTHER PUBLICATIONS

Mell et al., "The NIST Definition of Cloud Computing," National Institute of Standards and Technology, Sep. 2011, p. 1-3, Special Publication 800-145.

(Continued)

*Primary Examiner* — Thien F Tran
(74) *Attorney, Agent, or Firm* — Michael O'Keefe

(57) ABSTRACT

Forming a semiconductor structure, including epitaxially growing a first source drain region between a first fin in an N-FET region and a second fin in a P-FET region, forming a shallow trench isolation region separating the N-FET region and the P-FET region, conformally forming an insulator on exposed surfaces of the semiconductor structure, conformally forming a work function metal layer on exposed surfaces, conformally forming a liner, conformally forming an organic planarization layer, forming a titanium nitride layer, patterning a photo resist mask, forming an first opening between the N-FET region and the P-FET region, wherein a top surface of a portion of the liner is exposed at a bottom of the first opening, removing the portion of the liner between the N-FET region and the P-FET region and removing a portion of the work function metal layer between the N-FET region and the P-FET region.

13 Claims, 10 Drawing Sheets

(56) References Cited

U.S. PATENT DOCUMENTS

| | | |
|---|---|---|
| 9,425,053 B2 | 8/2016 | Glodde et al. |
| 9,431,305 B1 | 8/2016 | Anderson et al. |
| 2015/0162239 A1 | 6/2015 | Nguyen et al. |
| 2015/0263132 A1* | 9/2015 | Liu .................. H01L 29/66545 438/303 |
| 2016/0042954 A1 | 2/2016 | Sung et al. |
| 2016/0293721 A1 | 10/2016 | Chuang et al. |
| 2017/0025315 A1 | 1/2017 | Ando et al. |
| 2017/0103896 A1* | 4/2017 | Hung ................ H01L 29/66545 |

OTHER PUBLICATIONS

Anonymous, "Method to Enable Complete Wets Removal of Si HM Materials without Residue Using Mild Wets Chemistries", An IP.com Prior Art Database Technical Disclosure, Published Jul. 17, 2015, pp. 1-4.

* cited by examiner

US 10,176,997 B1

DIRECT GATE PATTERNING FOR VERTICAL TRANSPORT FIELD EFFECT TRANSISTOR

BACKGROUND

The present invention relates, generally, to the field of semiconductor manufacturing, and more particularly to fabricating field effect transistors.

Complementary Metal-oxide-semiconductor (CMOS) technology is commonly used for field effect transistors (hereinafter "FET") as part of advanced integrated circuits (hereinafter "IC"), such as central processing units (hereinafter "CPUs"), memory, storage devices, and the like. A vertical transport FET or vertical FET is a structure in which current flow is in the vertical direction flowing between a source/drain at a top of a fin and a second source/drain adjacent to a bottom of the fin, and a wrap-around gate surrounding a middle portion of the fin.

As demands to reduce the dimensions of transistor devices continue, vertical-type transistors such as vertical field effect transistors (vertical FETs or VFETs) help achieve a reduced FET device footprint while maintaining FET device performance. A vertical FET may use less surface area of a die than conventional FETs, which is needed with shrinking design rules.

In VFETs, the gate may be formed by a blanket metal stack deposition. To isolate and form individual devices and provide landing pads or connection pads for contacts, the gate metal of a fin may be patterned to electrically isolate from the gate metal of an adjacent fin. One technique to do this is direct gate patterning. Direct gate patterning consists of a lithography, dry etch and wet etch steps. It is important to avoiding damaging the gate metal during patterning to avoid device degradation. It may be challenging to strip lithography layers to perform the gate cut without simultaneously damaging the gate metal.

SUMMARY

According to an embodiment, a method is provided. The method may include forming a semiconductor structure, the method including epitaxially growing a first source drain region on the semiconductor structure between a first fin in an N-FET region of the semiconductor structure and a second fin in a P-FET region of the semiconductor structure, forming a shallow trench isolation region separating the N-FET region and the P-FET region, conformally forming an insulator on exposed surfaces of the semiconductor structure between the N-FET region and the P-FET region, conformally forming a work function metal layer on exposed surfaces of the semiconductor structure, conformally forming a liner on exposed surfaces of the semiconductor structure, conformally forming an organic planarization layer on exposed surfaces of the semiconductor structure, forming a titanium nitride layer on the exposed surfaces of the semiconductor structure, patterning a photo resist mask on exposed surfaces of the semiconductor structure, forming an first opening between the N-FET region and the P-FET region, wherein a top surface of a portion of the liner between the N-FET region and the P-FET region is exposed at a bottom of the first opening, removing the portion of the liner between the N-FET region and the P-FET region and removing a portion of the work function metal layer between the N-FET region and the P-FET region to expand the first opening, where a top surface of a portion of the insulator between the N-FET region and the P-FET region is exposed at a new bottom of the first opening.

According to an embodiment, a method is provided. The method may include forming a semiconductor structure, the method including forming an organic planarization layer on exposed surfaces of the semiconductor structure, where the organic planarization layer covers a first work function metal layer, conformally forming a second work function metal layer on the organic planarization layer, where a top surface of the organic planarization layer is coplanar with a bottom surface of the second work function metal layer, patterning a photo resist mask on exposed surfaces of the semiconductor structure, removing the second work function metal layer and the organic planarization layer selective to the photo resist mask, exposing a top surface of a liner between a first fin and a second fin; and removing remaining portions of the second work function metal layer, portions of the liner between the first fin and the second fin, and portions of the first work function metal layer between the first fin and the second fin, selective to a remaining portion of the organic planarization layer, exposing an insulator between the first fin and the second fin and electrically separating the first work function metal layer between the first fin and the second fin.

According to an embodiment, a structure is provided. The structure may include a first fin in an N-FET region on a semiconductor substrate, a second fin in a P-FET region on the semiconductor substrate; a first source drain region adjacent to a bottom portion of the first fin, a work function metal layer conformally surrounding sidewalls of both the first fin and the second fin, an organic planarization layer surrounding the work function metal layer, and a titanium nitride layer coplanar with a top surface of the organic planarization layer.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
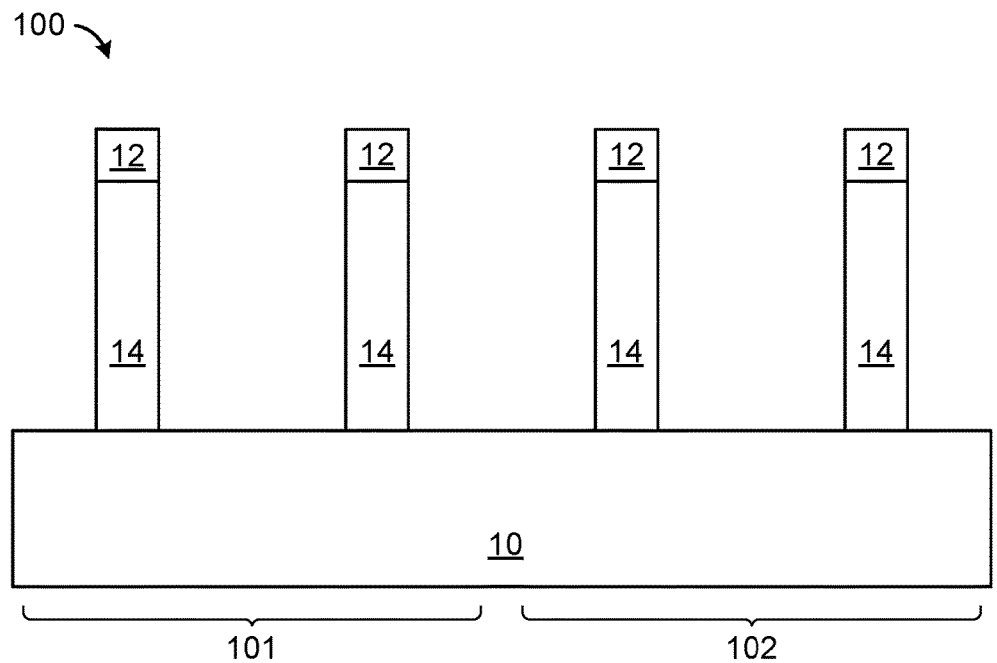
FIG. 1 illustrates a cross-sectional view of a semiconductor structure at an intermediate stage of fabrication, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor manufacturing and more particularly to fabricating a vertical field effect transistor (hereinafter "FET"). The vertical FET fabrication process may include processing a gate fabricated with a metal stack conformally deposited over a substrate, including a fin of the FET. The metal stack may need to be cut or electrically isolated between adjacent fins. Lithography or photolithography may be used to form a mask which may protect areas around the fin from subsequent processing. The subsequent processing may remove the metal stack between adjacent fins to provide electrical isolation between adjacent fins. Photolithography may use a photo resist for patterning a mask, where remaining portions of the mask over an area surrounding the fin may be blocked from subsequent processing. Fins such as those described below may require a mask of greater than 100 nm thick to enable a selective etch. However, photo resist typically should be less than 30 nm thick in order for light to penetrate an entire depth or thickness of the photo resist. Additionally, a relatively level surface is required for application of the photo resist. An organic planarization layer, (hereinafter "OPL"), may be used to provide the relatively level surface on a substrate and to provide etch selectivity of the OPL relative to a work function metal layer or metal stack. Photo resist cannot be directly formed on the OPL, and an intermediate hardmask may be used between the photo resist and the OPL. The resulting three layers may be referred to as a photolithography stack or a trilayer stack, which includes the OPL, a hardmask layer, and a photo resist layer. The trilayer stack can be greater than 100 nm thick, including a photo resist layer less than 30 nm thick. The hardmask may typically be a silicon containing antireflective coating layer, (hereinafter "SiARC"), resulting in a SiARC trilayer stack of the OPL, the SiARC, and the photo resist layer.

In a preferred embodiment, a titanium nitride layer may be used as the hardmask, which may be referred to as an intermediate hardmask, or as a lithography underlayer. In this embodiment, the trilayer stack may include the OPL, the titanium nitride layer, and the photo resist layer.

A method of manufacturing a vertical FET is described in detail below by referring to the accompanying drawings in FIGS. 1-18, in accordance with an illustrative embodiment.

Referring now to FIG. 1, a semiconductor structure 100 (hereinafter "structure") is shown according to an exemplary embodiment. The structure 100 of FIG. 1 may be formed or provided. The structure 100 may include a substrate 10. A fin 14 may be formed on the substrate 10. There may be a hardmask 12 covering a top of the fin 14. In an embodiment, the fin 14 may have a horizontal width, between 8 nm-15 nm, a height of 80 nm-100 nm, and a pitch of 36 nm-54 nm between adjacent fins. The fin 14 may have a length of 40 nm-65 nm. In an embodiment, the hardmask 12 may be about 10 nm high above a surface of the fin 14, although depths less than 10 nm and greater than 10 nm may be acceptable.

At this step of the manufacturing process, the beginning structure of a field effect transistor (hereinafter "FET") is shown. The FET may be formed on the substrate 10 according to techniques known in the art. The substrate 10 may include a negative channel field effect transistor (hereinafter "N-FET") region 101 and a positive channel field effect transistor (hereinafter "P-FET") region 102. As shown in FIG. 1, there are two fins 14 in the N-FET region 101 and two fins 14 in the P-FET102 region. There may be one or more fins 14 in the N-FET region 101 and one or more fins 14 in the P-FET region 102. Additional structures, (not shown), may be formed on the substrate 10.

In general, a FinFET device may include a plurality of fins 14 formed in the substrate 10. In this example, the FinFET may be formed from the substrate 10 using known photolithography and etch processes. It should also be noted, that in the context of FinFET devices the portion of the substrate 10 illustrated in the figures represents a cross-section view perpendicular with a length of the fin 14.

A FinFET device may include a plurality of fins formed in a substrate and a wrap-around gate covering a portion of each of the fins. The portion of each of the fins covered by the gate may serve as a channel region of the device. A top source drain region of the device may be located above the fin and a bottom source drain region may be located adjacent to a lower portion of a side of the fin.

The substrate 10 may be a bulk substrate, which may be made from any of several known semiconductor materials such as, for example, silicon, germanium, silicon-germanium alloy carbon-doped silicon-germanium alloy, and compound (e.g. III-V and II-VI) semiconductor materials. Non-limiting examples of compound semiconductor materials include gallium arsenide, indium arsenide, and indium phosphide. In other embodiments, the substrate 10 may be, for example, a layered semiconductor such as Si/SiGe, a silicon-on-insulator, or a SiGe-on-insulator, where a buried insulator layer separates a base substrate from a top semiconductor layer. In such cases, components of the structure 100 may be formed in or from the top semiconductor layer of the SOI substrate. Typically the substrate 10 may be approximately, but is not limited to, several hundred microns thick.

Figure 2:
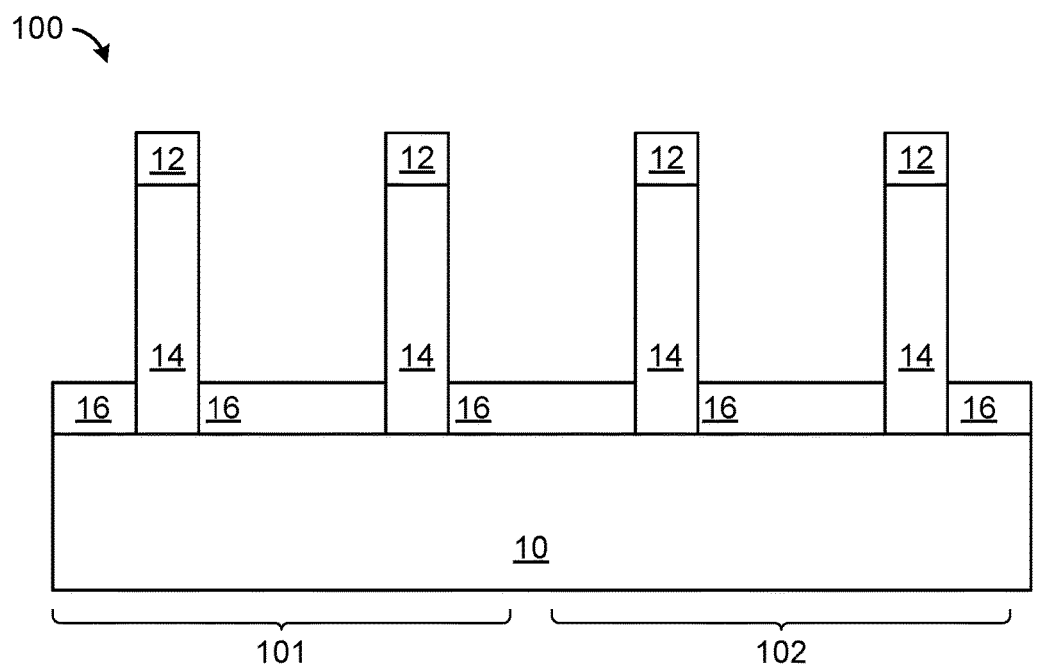
FIG. 2 illustrates a cross-sectional view of the semiconductor structure and illustrates growing epitaxy, according to an exemplary embodiment.

Referring now to FIG. 2, an epitaxy 16 may be formed on an exposed top surface of the substrate 10 between the fin 14 and an adjacent fin 14, according to an embodiment. The epitaxy 16 may be formed on either side of the fin 14, forming a bottom source/drain region. The epitaxy 16 may be selectively deposited on exposed surfaces of the substrate 10. The epitaxy 16 may be adjacent to a vertical side of the fin 14. Examples of various epitaxial growth techniques used in forming the epitaxy 16 may include, for example, rapid thermal chemical vapor deposition, low energy cluster beam deposition, ultra-high vacuum chemical vapor deposition, and atmospheric pressure chemical vapor deposition. In some cases, the epitaxy 16 may be formed directly on the substrate 10, as shown in FIG. 2. The epitaxy 16 may be doped during the epitaxy process (in-situ doping) or after the epitaxy process (ex-situ doping). A non-limiting list of exemplary epitaxial materials are: silicon germanium alloy (SiGe), silicon (Si), in-situ boron doped SiGe or Si, in situ phosphorus or arsenic doped Si or SiGe, with doping levels ranging from 1E19/cm$^3$ to 1.5E21 cm$^3$, with 4E20 cm$^3$ to 9E20 cm$^3$ dopant levels preferred. The epitaxy 16 may serve as a source/drain region of an FET in the N-FET region 101 and may be boron doped. The epitaxy 16 may serve as a source/drain region of an FET in the P-FET region 102 and may be silicon germanium doped. Thermal anneal such as laser anneal, rapid thermal anneal, flash anneal may be performed to activate dopants. In an embodiment, the epitaxy 16 may be about 10 nm high above a surface of the substrate 10 between the fin 14 and an adjacent fin 14, although depths less than 10 nm and greater than 10 nm may be acceptable. A width of the epitaxy 16 may preferably extend from the fin 14 and the adjacent fin 14, which typically ranges between from about 30 nm to 50 nm, and, although a width less than 30 nm and greater than 50 nm may be acceptable depending on pitch of the fins 14.

Figure 3:
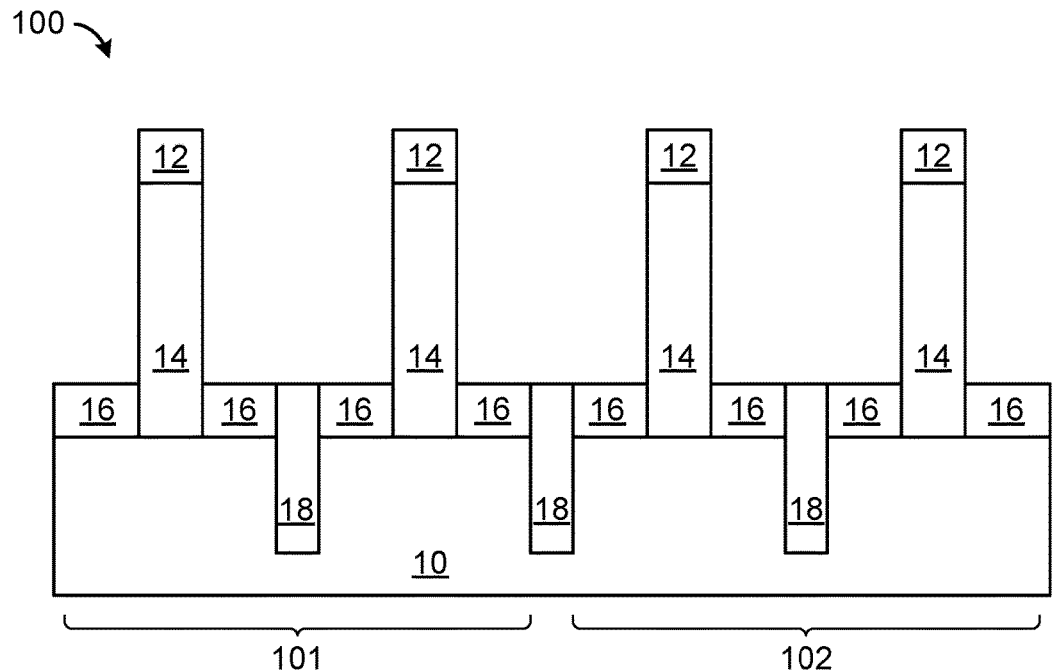
FIG. 3 illustrates a cross-sectional view of the semiconductor structure and illustrates forming a shallow trench isolation, according to an exemplary embodiment.

Referring now to FIG. 3, a shallow trench isolation region (hereinafter "STI") 18 may be formed using any known patterning technique, according to an embodiment. The STI 18 may be embedded in the substrate 10 where a portion of the substrate 10 and a portion of the epitaxy 16 has been removed between the fin 14 and an adjacent fin 14. After formation of the STI 18, a portion of the epitaxy 16 may remain between the fin 14 and the STI 18. The STI 18 may isolate a source drain region of the epitaxy 16 adjacent to the fin 14 from a source drain region of the epitaxy 16 adjacent to an adjacent fin 14. A horizontal top surface of the STI 18 may be essentially coplanar with a horizontal top surface of the epitaxy 16. In an embodiment, the STI 18 is formed by lithography and etch techniques, and is formed between the fin 14 and an adjacent fin 14. Alternatively, the STI 18 may be patterned by sidewall image transfer (SIT) technique. The STI 18 may be formed in the N-FET region 101 and may be formed in the P-FET region 102. The STI 18 may be formed between the N-FET region 101 and the P-FET region 102. In an embodiment, the STI 18 may be 30 nm deep below a surface of the epitaxy 16 which is adjacent to the STI 18, although depths greater than 30 nm and less than 30 nm may be acceptable. A width of the STI 18 may range from 30 nm to 50 nm, and ranges there between, although a width less than 30 nm and greater than 50 nm may be acceptable depending on spacing between individual devices.

Figure 4:
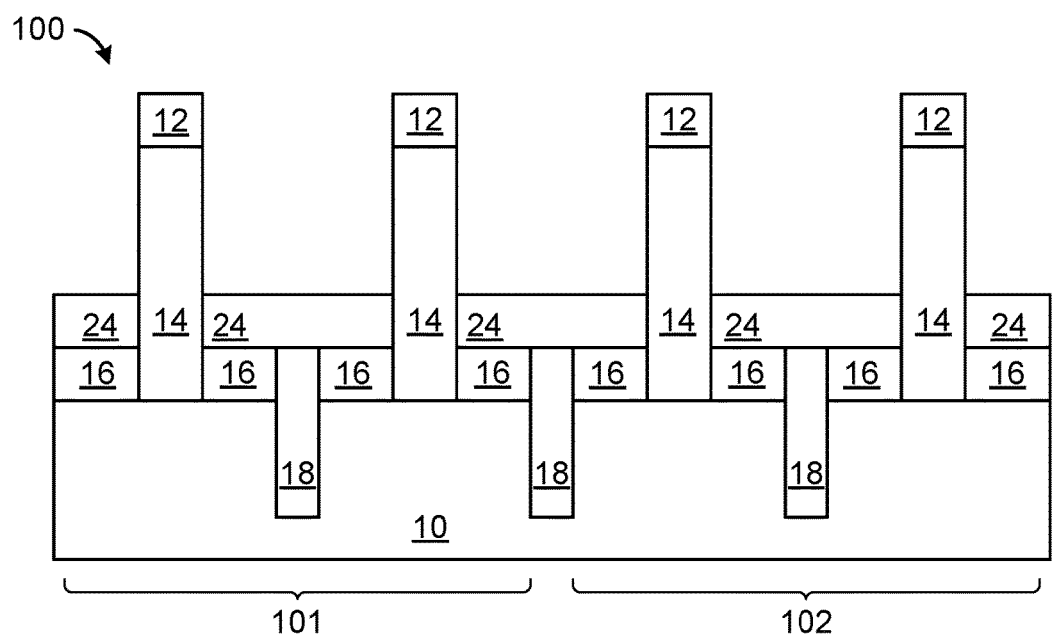
FIG. 4 illustrates a cross-sectional view of the semiconductor structure and illustrates forming a spacer, according to an exemplary embodiment.

Referring now to FIG. 4, a spacer 24 may be formed directly on exposed top surfaces of the structure 100, according to an exemplary embodiment. The spacer 24 may be formed by conformally depositing or growing a dielectric material, followed by a combination of dry and wet anisotropic etch and recessing steps to remove the dielectric material from a top of the hard mask 12 and from vertical surfaces of the structure 100, such as sidewalls of the fin 14 and sidewalls of the hardmask 12. After removal of portions of the dielectric material from the top of the hard mask 12 and from vertical surfaces of the sidewalls of the fin 14 and the hardmask 12, the dielectric material may remain on an exposed top surface of the STI 18, and an exposed top surface of the epitaxy 16, forming the spacer 24. The spacer 24 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the spacer 24 may include one or more layers. The spacer 24 may cover a top surface of the STI 18 and a top surface of the epitaxy 16. In an embodiment, the spacer 24 may include any dielectric material such as silicon oxide, silicon oxynitride, silicon nitride, SiBCN, SiOC, low-k dielectric or any combination of these materials. In an embodiment, the spacer 24 may be nitride. In an alternate embodiment, the spacer 24 may be oxide. In an embodiment, the spacer 24 may have a thickness ranging from about 5 nm to about 15 nm, and ranges there between, although a thickness less than 5 nm and greater than 15 nm may be acceptable.

Figure 5:
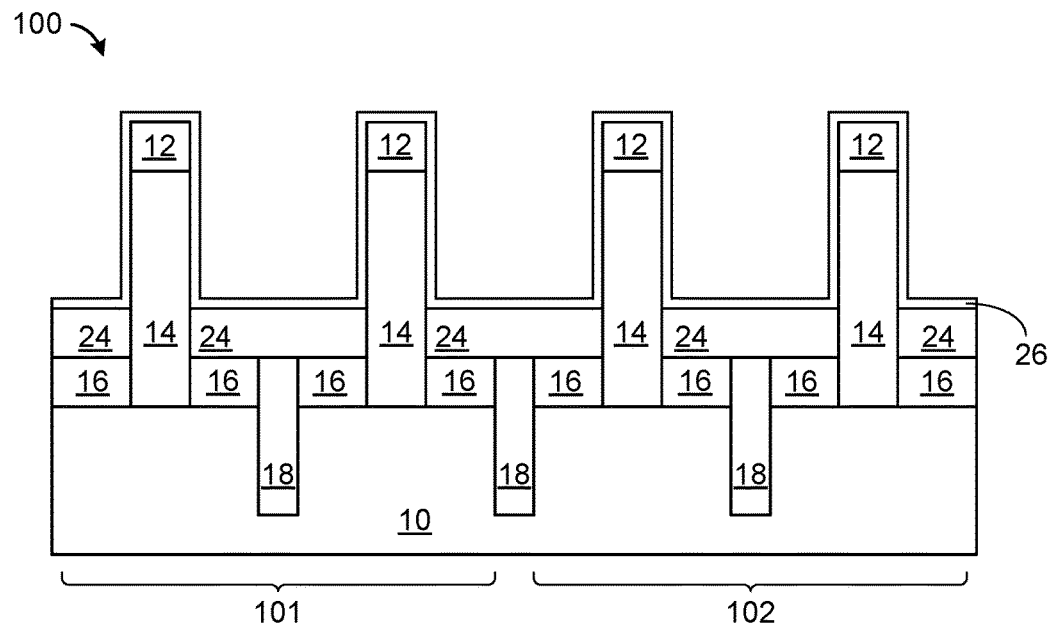
FIG. 5 illustrates a cross-sectional view of the semiconductor structure and illustrates forming an insulator layer, according to an exemplary embodiment.

Referring now to FIG. 5, an insulator 26 may be conformally deposited on exposed surfaces of the structure 100, according to an exemplary embodiment. The insulator 26 may be formed on a top surface of the spacer 24, on a portion of a vertical side surface of the fin 14, on a vertical side surface of the hardmask 12, and on a horizontal top surface of the hardmask 12. The insulator 26 may be deposited using typical deposition techniques, for example, atomic layer deposition (ALD), molecular layer deposition (MLD), chemical vapor deposition (CVD), physical vapor deposition (PVD), and spin on techniques, followed by an anisotropic vertical etch process such as a reactive ion etch (RIE), or any suitable etch process. The material of the insulator 26 may include silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The insulator 26 may further include dopants such as lanthanum and aluminum. In an embodiment, the insulator 26 may include hafnium oxide. In an embodiment, the insulator 26 may have a thickness ranging from about 1 nm to about 2 nm and ranges there between, although a thickness less than 1 nm and greater than 2 nm may be acceptable. In some cases, the insulator 26 may be referred to, and function as, a gate dielectric.

Figure 6:
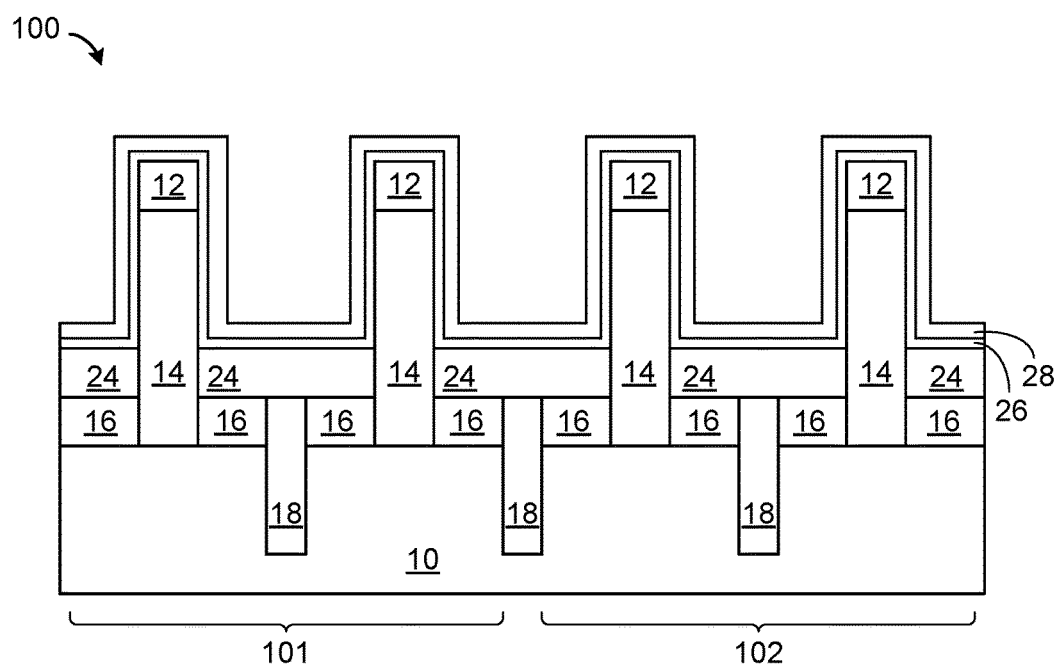
FIG. 6 illustrates a cross-sectional view of the semiconductor structure and illustrates forming a work function metal layer, according to an exemplary embodiment.

Referring now to FIG. 6, a work function metal layer (hereinafter "WFM") 28 may be conformally deposited on the structure 100, according to an exemplary embodiment. The WFM 28 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the WFM 28 may include one or more layers. The WFM 28 may be deposited on a top surface of the insulator 26. In an embodiment, the WFM 28 may include a work function metal including titanium nitride, tantalum nitride, titanium carbide or titanium aluminum carbide. In an embodiment, the WFM 28 in the N-FET region 101 may be titanium nitride and the WFM 28 in the P-FET region 102 may be titanium carbide or titanium aluminum carbide. In an embodiment, the WFM 28 may have a conformal thickness ranging from about 4 nm to about 6 nm, and ranges there between, although a thickness less than 4 nm and greater than 6 nm may be acceptable.

Figure 7:
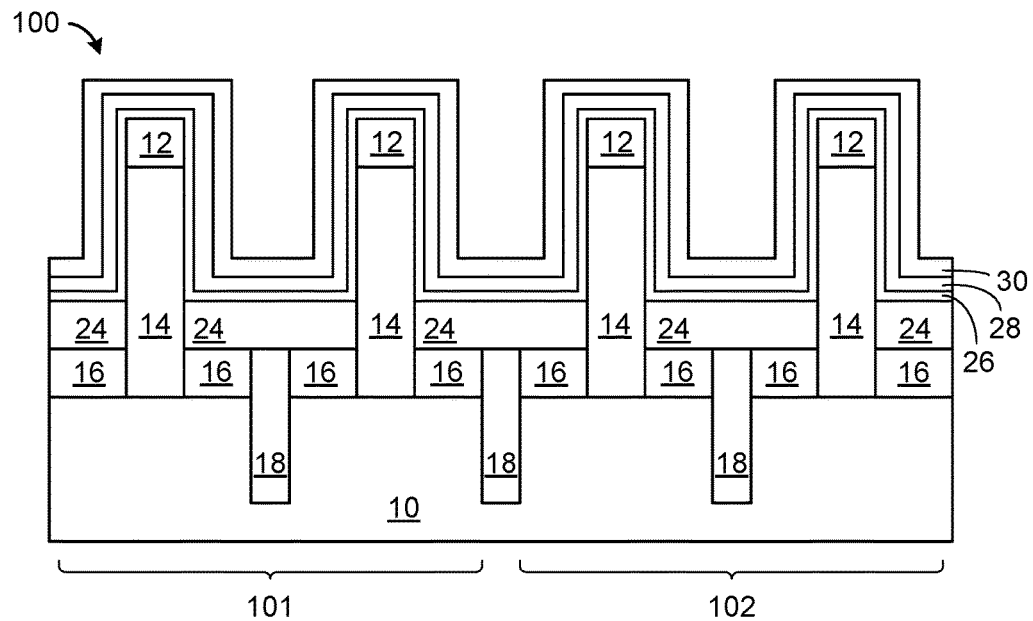
FIG. 7 illustrates a cross-sectional view of the semiconductor structure and illustrates forming a liner, according to an exemplary embodiment.

Referring now to FIG. 7, a liner 30 may be conformally deposited on the structure 100, according to an exemplary embodiment. The liner 30 may be deposited on the WFM 28. The liner 30 may be deposited using typical deposition techniques, for example, atomic layer deposition (ALD), molecular layer deposition (MLD), chemical vapor deposition (CVD), physical vapor deposition (PVD), and spin on techniques. The material of the liner 30 may include silicon nitride, amorphous silicon, silicon oxynitride, boron nitride, high-k materials, silicon oxide, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The liner 30 may further include dopants such as lanthanum, aluminum. In a preferred embodiment, the liner 30 may include silicon nitride or amorphous silicon. In an embodiment, the liner 30 may have a thickness about 8 nm to about 10 nm, although a thickness less than 8 nm and greater than 10 nm may be acceptable.

Figure 8:
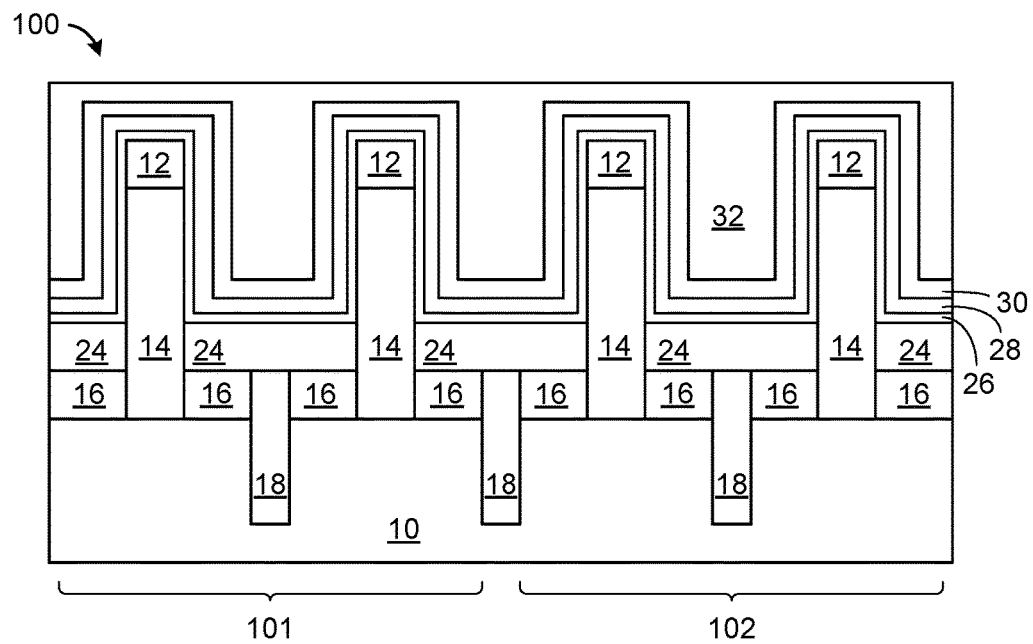
FIG. 8 illustrates a cross-sectional view of the semiconductor structure and illustrates forming an organic planarization layer, according to an exemplary embodiment.
Figure 9:
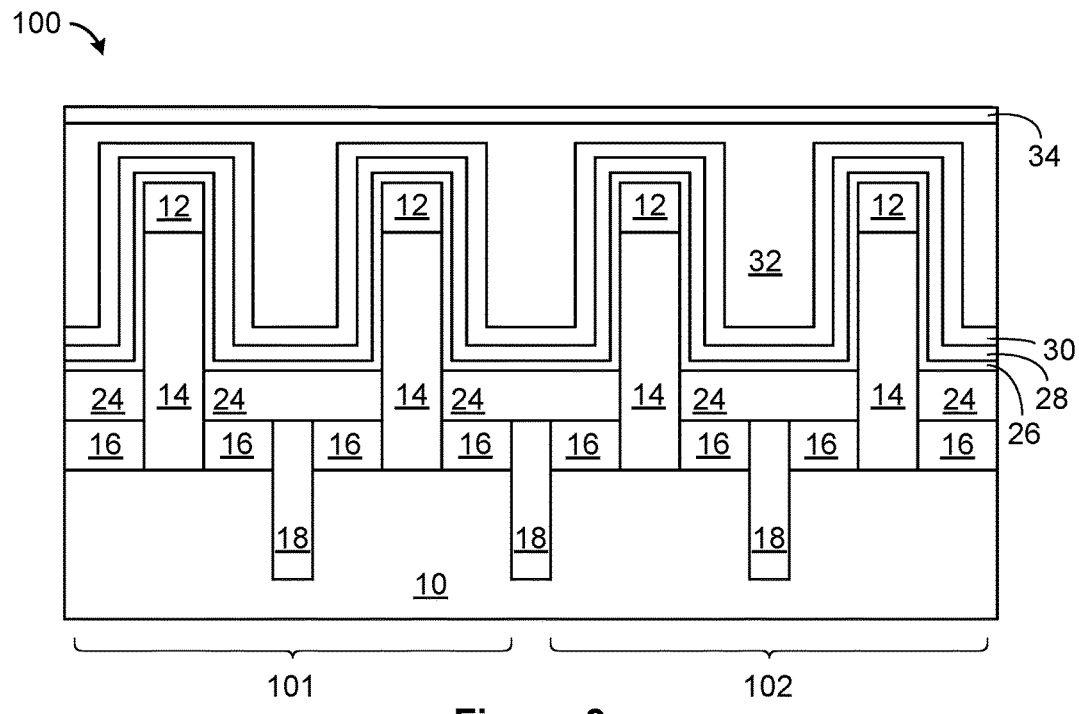
FIG. 9 illustrates a cross-sectional view of the semiconductor structure and illustrates forming a silicon containing antireflective coating layer, according to an exemplary embodiment.
Figure 10:
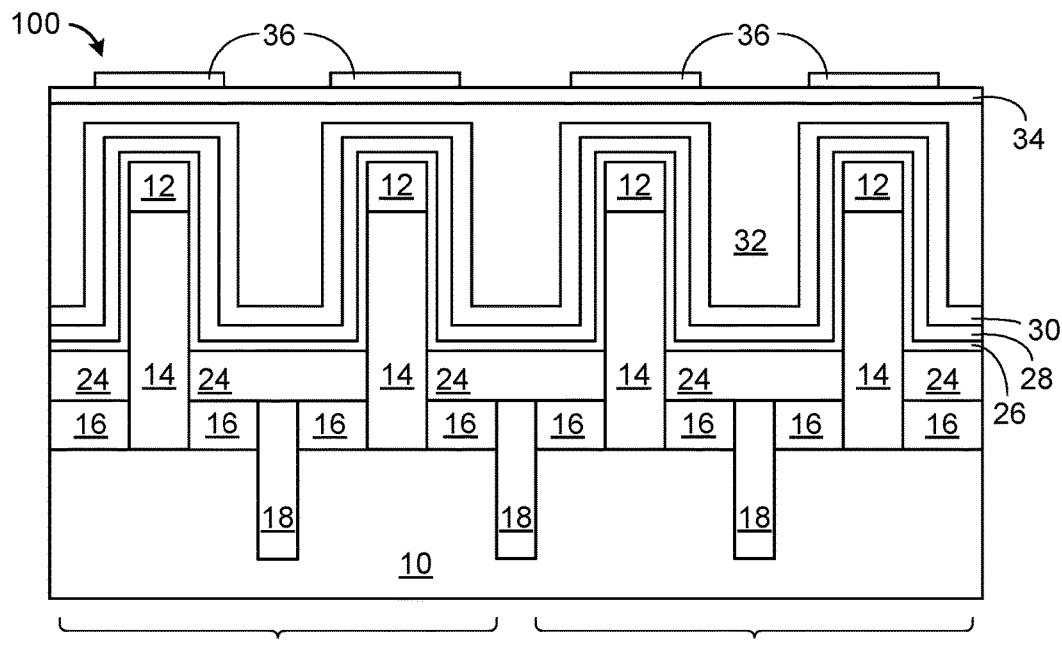
FIG. 10 illustrates a cross-sectional view of the semiconductor structure and illustrates depositing a mask, according to an exemplary embodiment.

Referring now to FIGS. 8, 9, and 10, a SiARC trilayer stack is formed. The SiARC trilayer stack may include three layers, for example, an organic planarization layer (hereinafter "OPL") 32, a silicon containing antireflective coating layer (hereinafter "SiARC") 34, and a photo resist mask 36. The three layers are further described below.

Referring now to FIG. 8, the OPL 32 may be formed on the structure 100, according to an exemplary embodiment. The OPL 32 may be formed directly on the liner 30. A top surface of the liner 30 may not be flat due to the uneven topography of the fin 14. Thus, deposition of the OPL 32 may provide a substantially flat surface for subsequent deposition of the SiARC 34 and the photo resist mask 36. The OPL 32 may be deposited with sufficient thickness to fill a space between the fin 14 and an adjacent fin 14 and completely cover the liner 30. The OPL 32 may be formed by a blanket deposition using typical deposition techniques, for example, atomic layer deposition (ALD), molecular layer deposition (MLD), chemical vapor deposition (CVD), physical vapor deposition (PVD), and spin on techniques. The material of the OPL 32 may include a photo-sensitive organic polymer including a light-sensitive material. The organic polymer may include epoxy resin, phenol resin, polyacrylate resin, polyamide resin, polyimide resin, unsaturated polyester resin, polyphenylenesulfide resin, polyphenylenether resin, or benzocyclobutene (BCB). The material of the OPL 32 may be selected to be compatible with the overlaying SiARC 34, and the photo resist mask 36. Specifically, an etch chemistry which may reduce the material of the OPL 32 may not etch or reduce the SiARC 23 nor the photo resist mask 36. The OPL 32 may subsequently be polished using a chemical mechanical polishing (hereinafter "CMP") technique or a multiple coat and recess process until a top surface of the OPL 32 is substantially planar, as illustrated. In an embodiment, the OPL 32 may have a thickness ranging from about 50 nm, where a minimum thickness may be measured above a surface of liner 30 at a point above a top surface of the fin 14 to a top surface of the OPL 32, to about 150 nm, where a maximum thickness may be measured from a top surface of the liner 30 between the fin 14 and an adjacent fin 14, and ranges there between, although a thickness less than 50 nm and greater than 150 nm may be acceptable. The OPL 32 may be thicker between the fin 14 and an adjacent fin 14, and may be thinner above the fin 14.

Referring now to FIG. 9, the SiARC 34 may be formed directly on an exposed top surface of the structure 100, according to an exemplary embodiment. The SiARC 34 may be formed directly on the OPL 32. The SiARC 34 may form a horizontal top surface of the structure 100. A bottom surface of the SiARC 34 may be essentially coplanar with a top surface of the OPL 32. The SiARC 34 may be deposited using typical deposition techniques, for example, atomic layer deposition (ALD), molecular layer deposition (MLD), chemical vapor deposition (CVD), physical vapor deposition (PVD), and spin on techniques. The material of the SiARC 34 may include silicon containing anti-reflective coating, silicon oxide, silicon, carbon, hydrogen, and oxygen. There may be one or more layers of the SiARC 34. In an embodiment, the SiARC 34 may have a thickness ranging from about 20 nm to about 50 nm and ranges there between, although a thickness less than 20 nm and greater than 50 nm may be acceptable.

Referring now to FIG. 10, the photo resist mask 36 may be deposited and patterned on the structure 100, according to an exemplary embodiment. The photo resist mask 36 may be formed directly on the SiARC 34. The photo resist mask 36 may be first spin coated and optionally polished using a chemical mechanical polishing (CMP) technique. The photo resist mask 36 may be subsequently exposed, typically using extreme ultraviolet lithography (EUV) in order to enable sub-80-nm pitch gate patterns. The photo resist mask 36 may mask a portion of the SiARC 34, a portion of the OPL 32, and a portion of the liner 30 along a vertical sidewall of the fin 14, and may protect an area over the fin 14 from subsequent processing steps, allowing separate processing in the area of the fin 14 and an area between the fin 14 and an adjacent fin 14. In an embodiment, the photo resist mask 36 may have a height ranging from about 20 nm to 70 nm, and ranges there between, although a thickness less than 30 nm and greater than 70 nm may be acceptable.

Figure 11:
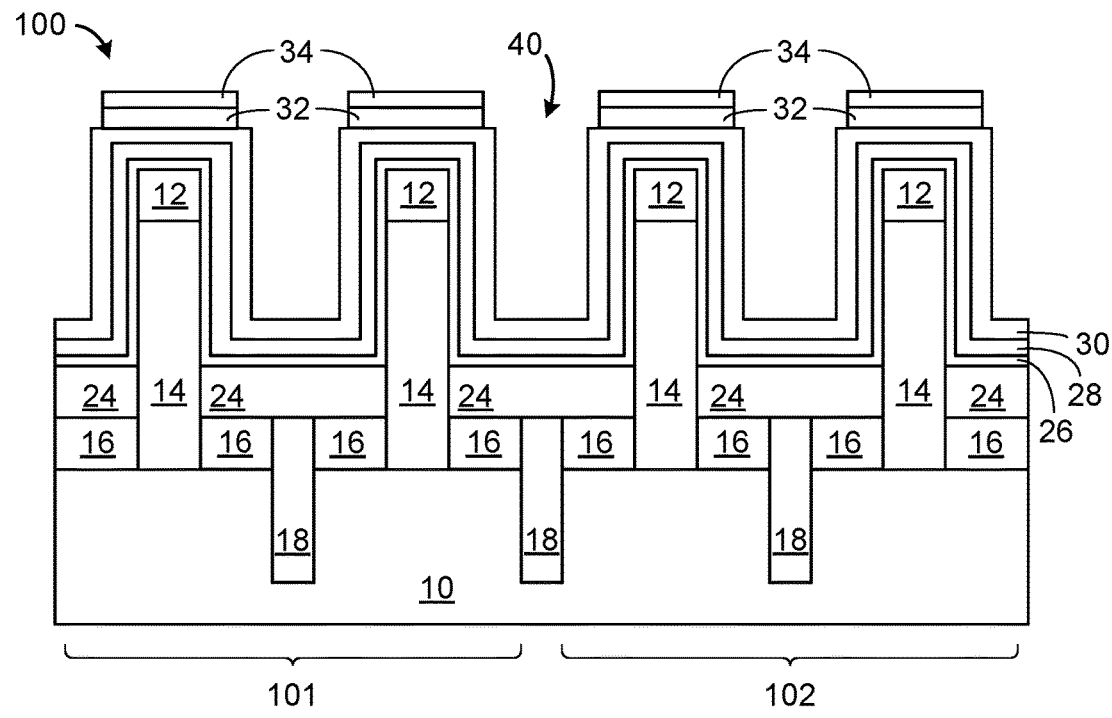
FIG. 11 illustrates a cross-sectional view of the semiconductor structure and illustrates forming a first opening, according to an exemplary embodiment.

Referring now to FIG. 11, a first opening 40 may be formed by recessing/etching the OPL 32, and the SiARC 34, selective to the photo resist mask 36, until a top surface of the liner 30 is exposed in an area between a fin 14 and an adjacent fin 14, according to an exemplary embodiment. The first opening 40 may be formed using an anisotropic vertical etch process such as a reactive ion etch (RIE), or any suitable etch process. The photo resist mask 36 may protect a portion of the SiARC 34 and a portion of the OPL 32 in an area directly above the fin 14. The SiARC 34 may be removed in an area between the fin 14 and an adjacent fin 14. The OPL 32 may be removed in an area between the fin 14 and an adjacent fin 14. A top surface of the liner 30 may be exposed along a portion of a vertical sidewall of the fin 14 and in an area between the fin 14 and an adjacent fin 14. A portion of the insulator 26, a portion of the WFM 28, and a portion of the liner 30 may remain alongside a portion of a vertical sidewall of the fin 14.

The photo resist mask 36 may be subsequently removed after etching according to known techniques.

Figure 12:
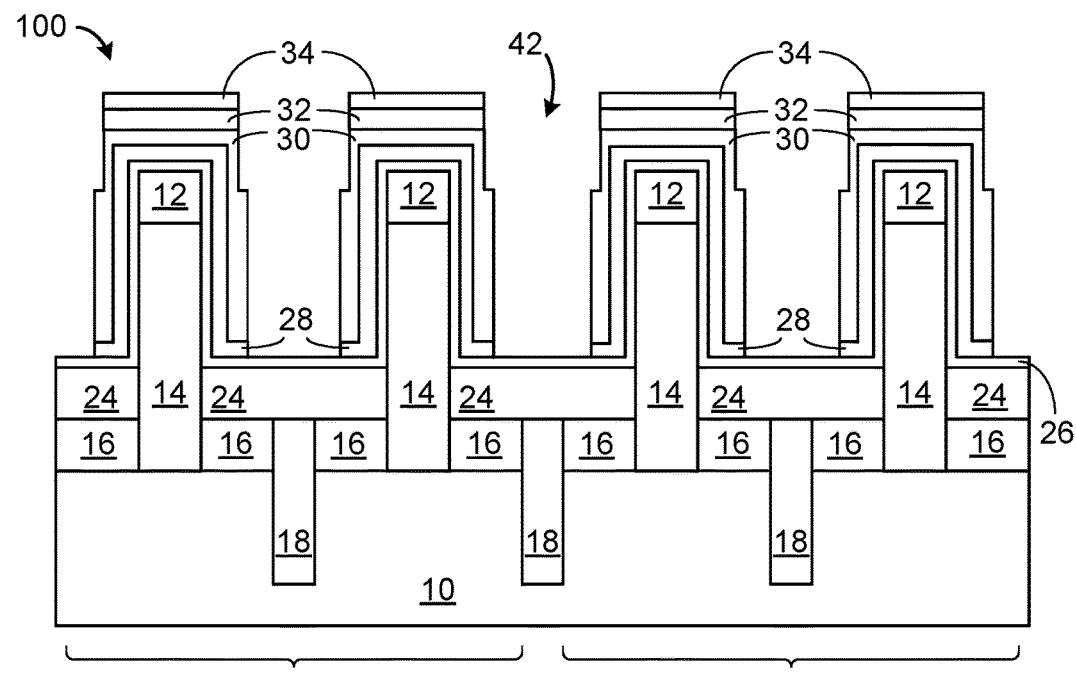
FIG. 12 illustrates a cross-sectional view of the semiconductor structure and illustrates forming a second opening, according to an exemplary embodiment.

Referring now to FIG. 12, a second opening 42 may be formed by etching the liner 30 and the WFM 28 selective to the SiARC 34 which remains over the fin 14. A different etch chemistry may be used to form the second opening 42 than was used to form the first opening 40. Etching may continue until a top surface of the insulator 26 is exposed in an area between the fin 14 and an adjacent fin 14, according to an exemplary embodiment. The second opening 42 may be formed using an anisotropic vertical etch process such as a reactive ion etch (RIE), or any suitable etch process. The second opening 42 may be larger than the first opening 40. The SiARC 34 may mask the OPL 32 in an area over the fin 14. A portion of the liner 30 may be removed along a sidewall of the fin 14 and an adjacent fin 14. A portion of the WFM 28 may be removed in an area between the fin 14 and an adjacent fin 14. A portion of the insulator 26, a portion of the WFM 28, and a portion of the liner 30 may remain alongside a portion of a vertical sidewall of the fin 14.

An additional etch step is required to remove remaining portions of the SiARC 34 above the fin 14, in this embodiment.

The WFM 28 may now be electrically isolated between adjacent fins. The WFM 28 surrounding a portion of the fin 14 may be a gate of a first finFET device, and the electrically isolated WFM 28 surround a portion of an adjacent fin 14 may be a gate for a second finFET device. Thus, the gate for the fin 14 may be electrically isolated from the adjacent gate of the adjacent fin 14.

Figure 13:
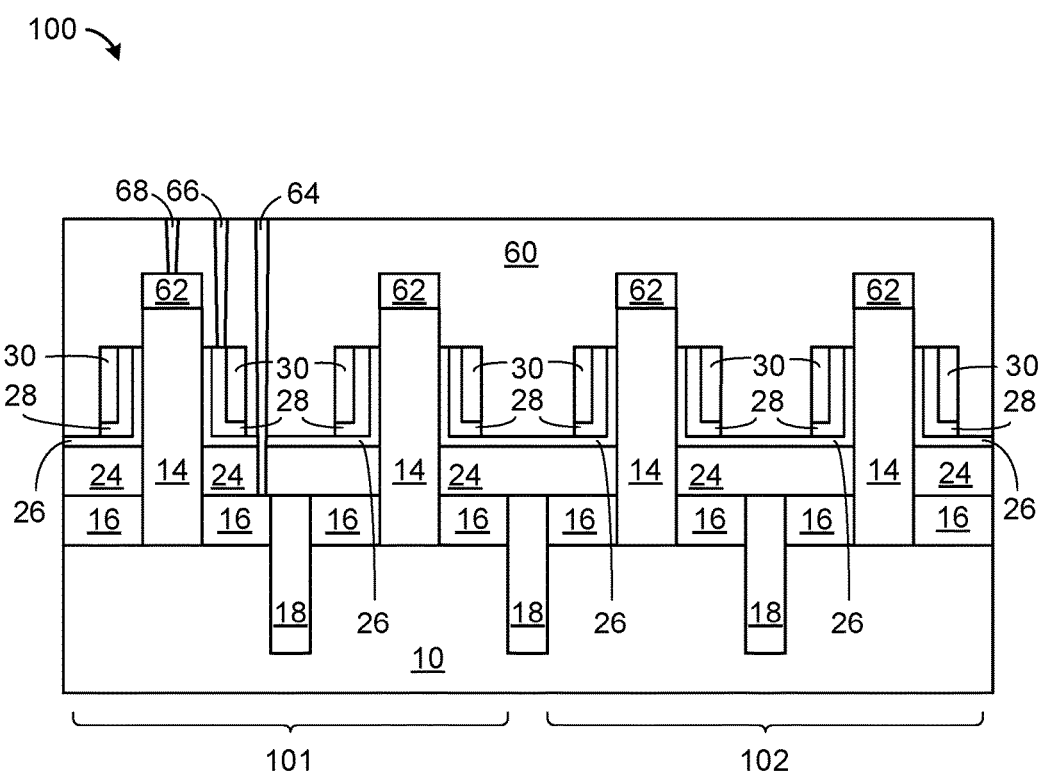
FIG. 13 illustrates a cross-sectional view of the semiconductor structure and illustrates forming contacts, according to an exemplary embodiment.

Referring now to FIG. 13, several processing steps may be performed to the structure 100, according to an exemplary embodiment. The SiARC 34, and the OPL 32 may be removed. The liner 30, the WFM 28 and the insulator 26 may be recessing from a portion of the vertical sidewalls of the fin 12, leaving a remaining portion of the liner 30, the WFM 28 and the insulator 26 along a remaining portion of the vertical sidewalls of the fin 12. The insulator 26 may remain between the fin 12 and an adjacent fin 12, covering the spacer 24. The hard mask 12 may be removed from a vertical top surface of the fin 12 and replaced with a top epitaxy 62. A dielectric 60 may be formed over the structure 100, covering a top surface of the top epitaxy 62, a portion of a horizontal side surface of the fin 14, a top surface of the liner 30, a top surface of the WFM 28, and a top surface of the insulator 26. Openings may be made in the dielectric 60, in which contacts may be formed. A top source drain contact 68 may be formed which connects to the top epitaxy 62. A gate contact 66 may be formed which connects to the WFM 28. A bottom source drain contact may be formed through the dielectric 60, the insulator 26, and the spacer 24, connecting to the epitaxy 16. Each of the steps illustrated and described in regards to FIG. 13 may be performed in one or more steps, may be performed simultaneously, may be performed in an alternate sequence, and may be performed using known semiconductor manufacturing processes.

Figure 14:
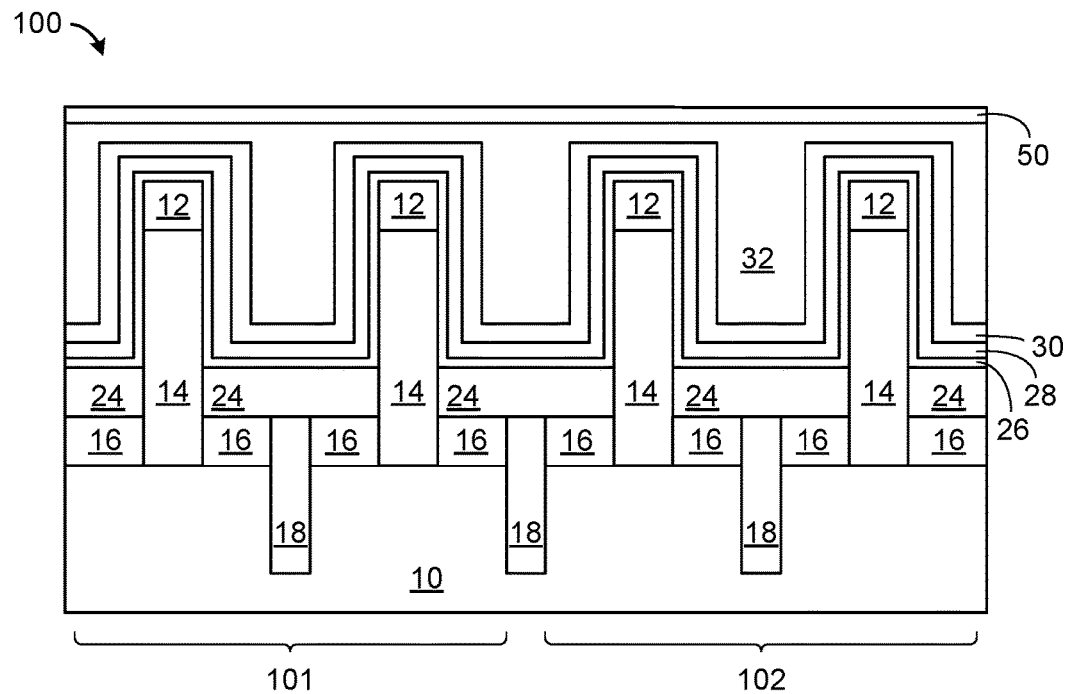
FIG. 14 illustrates a cross-sectional view of the semiconductor structure and illustrates forming a titanium nitride layer, according to an exemplary embodiment.
Figure 15:
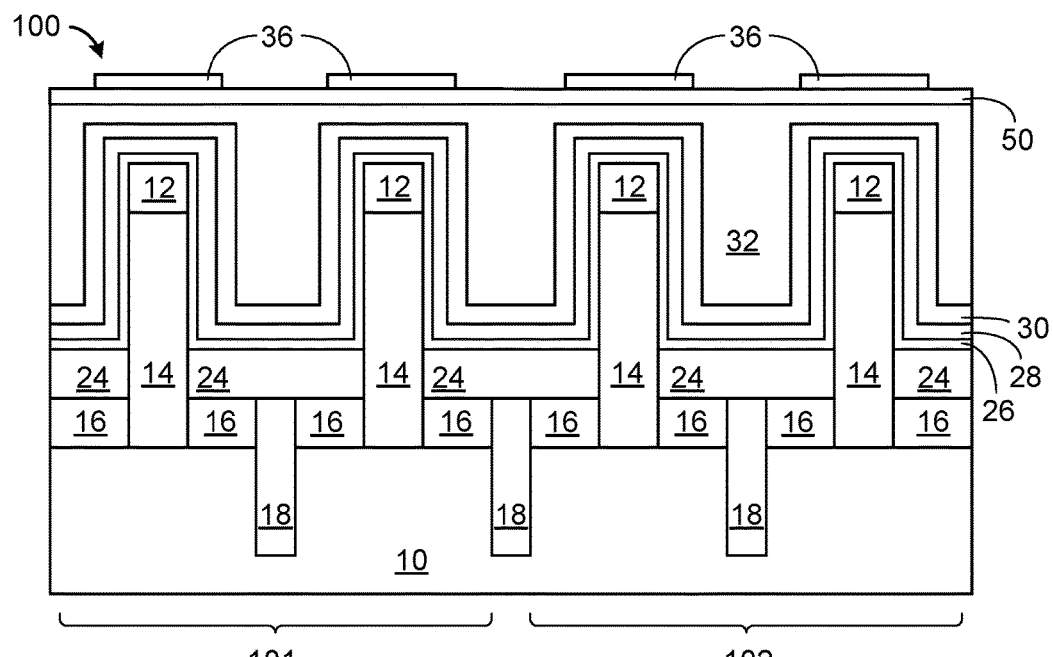
FIG. 15 illustrates a cross-sectional view of the semiconductor structure and illustrates forming a mask, according to an exemplary embodiment.

An alternate embodiment of forming a photolithography stack is now shown. The photolithography stack includes three layers. The three layers include an organic planarization layer (hereinafter "OPL") 32, as shown in FIG. 8, a titanium nitride (hereinafter "TiN") layer 50, as shown in FIG. 14, and the photo resist mask 36 as shown in FIG. 15. In this embodiment, TiN is used in place of the SiARC 34 described above. The TiN layer 50 is used as a lithography underlayer in extreme ultraviolet wavelength direct gate patterning. Extreme ultraviolet wavelength lithography may refer to 13.5 nm wavelength light, and may be used for direct patterning of the photoresist with less than 80 nm pitch structures. The TiN layer 50 may be removed simultaneously during a gate metal stack etch, and eliminate a need for a separate lithography layer strip. This embodiment may result in a less damaging process to the substrate 100 due to fewer etch processing steps, as compared to the process described above in relation to FIGS. 9-13, which requires a further etch step to remove remaining portions of the SiARC 34 above the fin 14.

Referring now to FIG. 14, the TiN layer 50 may be conformally formed directly on an exposed top surface of the structure 100, according to an exemplary embodiment. The TiN layer 50 may be formed directly on the OPL 32. The TiN layer 50 may form a horizontal top surface of the structure 100. A bottom surface of the TiN layer 50 may be essentially coplanar with a top surface of the OPL 32. The TiN layer 50 may be deposited using typical deposition techniques, for example, atomic layer deposition (ALD), molecular layer deposition (MLD), chemical vapor deposition (CVD), physical vapor deposition (PVD), and spin on techniques. The material of the TiN layer 50 may include titanium nitride, titanium oxide, titanium carbon, and other materials which are similar in chemistry to the work function metal. The TiN layer 50 may include one or more layers. In an embodiment, a thickness of the TiN layer 50 may be equal to or close to a thickness of the WFM 28 layer. In an embodiment, a material of the TiN layer 50 may be the same material as the WFM 28 layer. In an embodiment, the TiN layer 50 may have a thickness ranging from about 5 nm to about 10 nm and ranges there between to match the thickness of the WFM, although a thickness less than 5 nm and greater than 10 nm may be acceptable.

Referring now to FIG. 15, the photo resist mask 36 may be deposited and patterned on the structure 100, according to an exemplary embodiment. The photo resist mask 36 may be substantially similar to the photo resist mask 36 as shown in FIG. 10. The photo resist mask 36 may be formed directly on the TiN layer 50 and may be formed similarly to the photo resist mask 32 as described above in FIG. 9. The photo resist mask 36 may be first spin coated and optionally polished using a chemical mechanical polishing (CMP) technique. The photo resist mask 36 may be subsequently exposed, typically using extreme ultraviolet lithography (EUV) in order to enable sub-80-nm pitch gate patterns. The photo resist mask 36 may mask a portion of the TiN layer 50, a portion of the OPL 32, and a portion of the liner 30 along a vertical sidewall of the fin 14, and may protect an area over the fin 14 from subsequent processing steps, allowing separate processing in the area of the fin 14 and an area between the fin 14 and an adjacent fin 14. In an embodiment, the photo resist mask 36 may have a height ranging from about 20 nm to 70 nm, and ranges there between, although a thickness less than 30 nm and greater than 70 nm may be acceptable.

The photo resist mask 36 as shown in FIGS. 10 and 15, may each be processed using extreme ultraviolet (hereinafter "EUV") lithography. The TiN layer 50 may be compatible with extreme ultraviolet (EUV) lithography because anti-reflectivity is not necessary at EUV wavelengths, and a reflective material such as TiN is a viable alternate material to use rather than SiARC.

Figure 16:
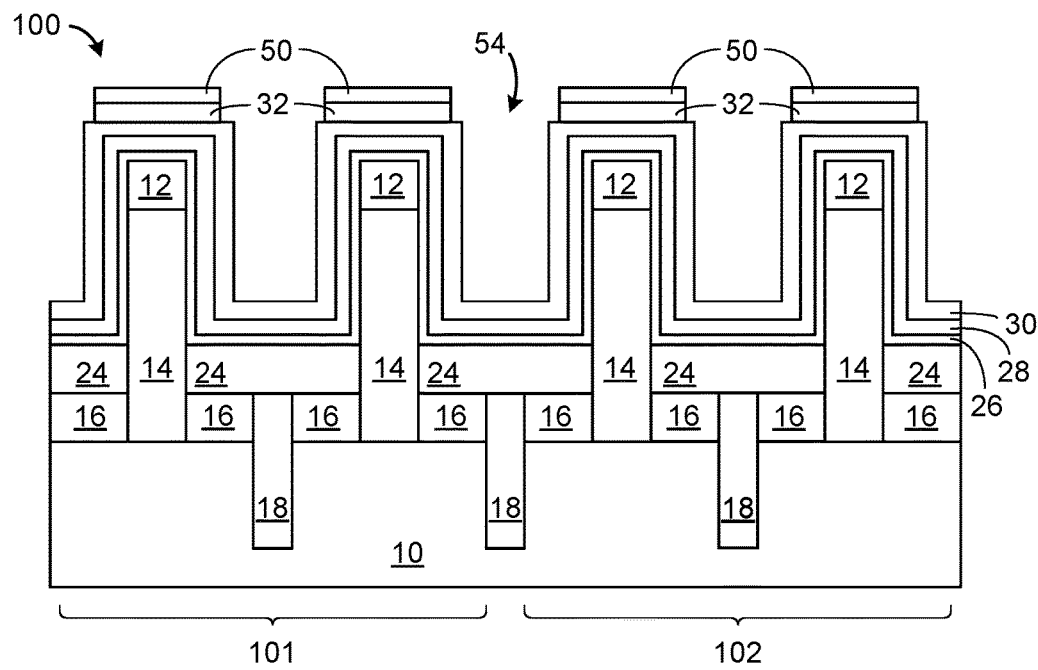
FIG. 16 illustrates a cross-sectional view of the semiconductor structure and illustrates etching the semiconductor structure, according to an exemplary embodiment.

Referring now to FIG. 16, a third opening 54 may be formed by recessing/etching the OPL 32, and the TiN layer 50, selective to the photo resist mask 36, until a top surface of the liner 30 is exposed in an area between a fin 14 and an adjacent fin 14, according to an exemplary embodiment. The third opening 54 may be formed using an anisotropic vertical etch process such as a reactive ion etch (RIE), or any suitable etch process. The photo resist mask 36 may protect a portion of the TiN layer 50 and a portion of the OPL 32 in an area directly above the fin 14. The TiN layer 50 may be removed in an area between the fin 14 and an adjacent fin 14. The OPL 32 may be removed in an area between the fin 14 and an adjacent fin 14. A top surface of the liner 30 may be exposed along a portion of a vertical sidewall of the fin 14 and in an area between the fin 14 and an adjacent fin 14. A portion of the insulator 26, a portion of the WFM 28, and a portion of the liner 30 may remain alongside a portion of a vertical sidewall of the fin 14.

The photo resist mask 36 may be subsequently removed after etching according to known techniques.

Figure 17:
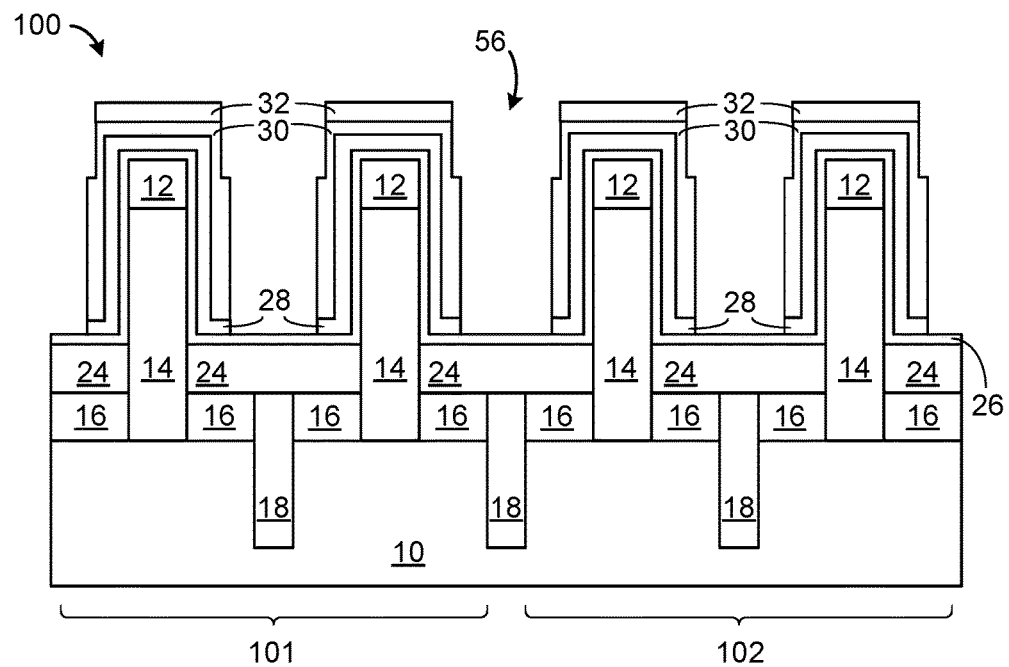
FIG. 17 illustrates a cross-sectional view of the semiconductor structure and illustrates etching the semiconductor structure, according to an exemplary embodiment.

Referring now to FIG. 17, a fourth opening 56 may be formed by recessing/etching the WFM 28 selective to the TiN layer 50 which remains over the fin 14. A different etch chemistry may be used to form the fourth opening 56 than was used to form the third opening 54. Etching may continue until a top surface of the insulator 26 is exposed in an area between the fin 14 and an adjacent fin 14, increasing a width and a depth of the third opening 54, according to an exemplary embodiment. The fourth opening 56 may be formed using an anisotropic vertical etch process such as a reactive ion etch (RIE), or any suitable etch process. The fourth opening 56 may be larger than the third opening 54. The TiN layer 50 may mask the OPL 32 in an area over the fin 14. A portion of the liner 30 may be removed along a sidewall of the fin 14 and an adjacent fin 14. A portion of the liner 30 may be removed in an area between the fin 14 and an adjacent fin 14. A portion of the WFM 28 may be removed in an area between the fin 14 and an adjacent fin 14. A portion of the insulator 26, a portion of the WFM 28, and a portion of the liner 30 may remain alongside a portion of a vertical sidewall of the fin 14.

In this embodiment, processing to form the fourth opening 56 may simultaneously remove remaining portions of the TiN layer 50. Thus, a further etch step is not required to remove remaining portions of the TiN layer 50 above the fin 14. The use of the TiN layer 50 instead of the SiARC 34 as described above, results in fewer etching steps.

The embodiment as shown in FIG. 12 requires an additional etching step, compared to the embodiment as shown in FIG. 16, due to use of the SiARC 34 rather than the TiN layer 50. Using the TiN layer 50 as the hard mask layer of the photolithography stack has the advantages of reduced risk of erosion or unintended etching of the insulator 26, unintended further etching to the WFM 28, and possible organic planarization layer 32 residue, due to one less etch step required for removal of any remaining TiN layer 50. Disadvantages of using the SiARC 34 rather than the TiN layer 50 include possible incomplete SiARC 34 removal which may result in residue deposited on the structure 100, organic planarization layer 32 ash residue, and a reduced gate size of the wrap around gate of the WFM 28 due to the additional etch step, all of which may affect functionality and reliability of the structure 100.

The WFM 28 may now be electrically isolated between adjacent fins. The WFM 28 may be a gate of a finFET device. Thus, the gate for a fin 14 is electrically isolated from the adjacent gate of the fin 14.

Figure 18:
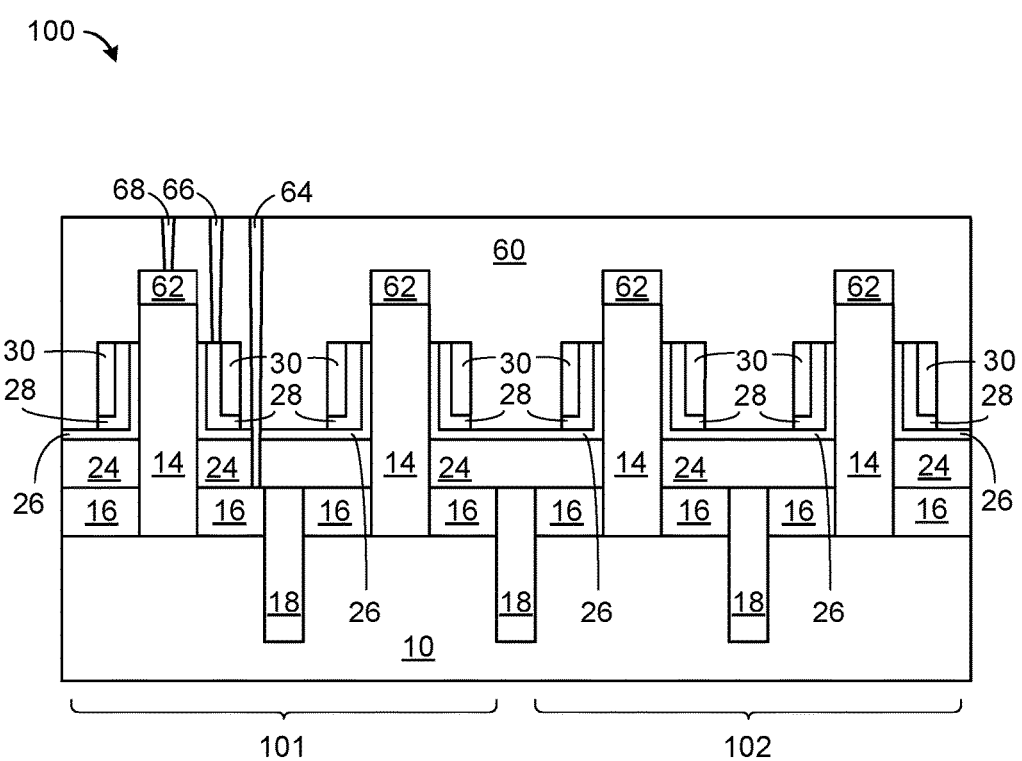
FIG. 18 illustrates a cross-sectional view of the semiconductor structure and illustrates forming contacts, according to an exemplary embodiment.

Referring now to FIG. 18, several processing steps may be performed to the structure 100, according to an exemplary embodiment. In this embodiment, there is at least one less processing step, as the SiARC 34 does not need to be removed, compared to the earlier embodiment as shown in FIG. 13. The OPL 32 may be removed. The liner 30, the WFM 28 and the insulator 26 may be recessing from a portion of the vertical sidewalls of the fin 12, leaving a remaining portion of the liner 30, the WFM 28 and the insulator 26 along a remaining portion of the vertical sidewalls of the fin 12. The insulator 26 may remain between the fin 12 and a remaining fin 12, covering the spacer 24. The hard mask 12 may be removed from a vertical top surface of the fin 12. A top epitaxy 62 may be formed on the horizontal top surface of the fin 14. A dielectric 60 may be formed over the structure 100, covering a top surface of the top epitaxy 62, a portion of a horizontal side surface of the fin 14, a top surface of the liner 30, a top surface of the WFM 28, and a top surface of the insulator 26. Openings may be made in the dielectric 60, in which contacts may be formed. A top source drain contact 68 may be formed which connects to the top epitaxy 62. A gate contact 66 may be formed which connects to the WFM 28. A bottom source drain contact may be formed through the dielectric 60, the insulator 26, and the spacer 24, connecting to the epitaxy 16. Each of the steps illustrated and described in regards to FIG. 13 may be performed in one or more steps, may be performed simultaneously, may be performed in an alternate sequence, and may be performed using known semiconductor manufacturing processes.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method for forming a semiconductor structure, the method comprising:
    epitaxially growing a first source drain region on the semiconductor structure between a first fin in an N-FET region of the semiconductor structure and a second fin in a P-FET region of the semiconductor structure;
    forming a shallow trench isolation region separating the N-FET region and the P-FET region;
    conformally forming an insulator on exposed surfaces of the semiconductor structure between the N-FET region and the P-FET region;
    conformally forming a work function metal layer on exposed surfaces of the semiconductor structure;
    conformally forming a liner on exposed surfaces of the semiconductor structure;
    conformally forming an organic planarization layer on exposed surfaces of the semiconductor structure;
    forming a titanium nitride layer on the exposed surfaces of the semiconductor structure;
    patterning a photo resist mask on exposed surfaces of the semiconductor structure;
    forming an first opening between the N-FET region and the P-FET region, wherein a top surface of a portion of the liner between the N-FET region and the P-FET region is exposed at a bottom of the first opening; and
    removing the portion of the liner between the N-FET region and the P-FET region and removing a portion of the work function metal layer between the N-FET region and the P-FET region to expand the first opening, wherein a top surface of a portion of the insulator between the N-FET region and the P-FET region is exposed at a new bottom of the first opening.

2. The method according to claim 1, further comprising:
    forming a spacer on a horizontal top surface of the first source drain region, wherein a horizontal top surface of the first source drain region is coplanar with a horizontal bottom surface of the spacer.

3. The method according to claim 2, wherein the spacer comprises a nitride.

4. The method according to claim 1, wherein the insulator comprises hafnium oxide.

5. The method according to claim 1, wherein the work function metal layer comprises titanium nitride.

6. The method according to claim 1, further comprising:
    epitaxially growing a second source drain region above a top surface of the first fin in the N-FET region and above a second fin in the P-FET region.

7. The method according to claim 1, wherein the liner comprises silicon nitride.

8. The method according to claim 1, wherein expanding the first opening between the N-FET region and the P-FET region, wherein a second bottom of the first opening is a top surface of a portion of the insulator further comprises simultaneously removing the titanium nitride layer.

9. A method for forming a semiconductor structure, the method comprising:
    forming an organic planarization layer on exposed surfaces of the semiconductor structure, wherein the organic planarization layer covers a first work function metal layer;
    conformally forming a second work function metal layer on the organic planarization layer, wherein a top surface of the organic planarization layer is coplanar with a bottom surface of the second work function metal layer;
    patterning a photo resist mask on exposed surfaces of the semiconductor structure;
    removing the second work function metal layer and the organic planarization layer selective to the photo resist mask, exposing a top surface of a liner between a first fin and a second fin; and
    removing remaining portions of the second work function metal layer, portions of the liner between the first fin and the second fin, and portions of the first work function metal layer between the first fin and the second fin, selective to a remaining portion of the organic planarization layer, exposing an insulator between the first fin and the second fin and electrically separating the first work function metal layer between the first fin and the second fin.

10. The method according to claim 9, further comprising:
    epitaxially growing a first source drain region in a substrate of the semiconductor structure between the first fin and the second fin;
    epitaxially growing a second source drain region above a top surface of each of the first fin and the second fin.

11. The method according to claim 9, further comprising:
    conformally forming an insulator on exposed surfaces of the semiconductor structure between the first fin and the second fin.

12. The method according to claim 9, further comprising:
    simultaneously removing portions of the second work function metal layer, portions of the liner between the first fin and the second fin, and portions of the first work function metal layer between the first fin and the second fin, selective to a remaining portion of the organic planarization layer.

13. The method according to claim 9, wherein the first work function metal layer and the second work function metal layer each comprise titanium nitride.

* * * * *